(12) United States Patent
Tilke et al.

(10) Patent No.: US 7,749,859 B2  
(45) Date of Patent: Jul. 6, 2010

(54) SEMICONDUCTOR DEVICES AND METHODS OF MANUFACTURE THEREOF

(75) Inventors: Armin Tilke, Dresden (DE); Cajetan Wagner, Dresden (DE); Lincoln O'Riain, Dresden (DE)

(73) Assignee: Infineon Technologies AG, Munich (DE)

( * ) Notice: Subject to any disclaimer, the term of this patent is extended or adjusted under 35 U.S.C. 154(b) by 424 days.

(21) Appl. No.: 11/771,583

(22) Filed: Jun. 29, 2007

(65) Prior Publication Data

US 2009/0001502 A1 Jan. 1, 2009

(51) Int. Cl.
*H01L 29/00* (2006.01)

(52) U.S. Cl. ........... 438/429; 438/433; 257/E21.546

(58) Field of Classification Search .......... 438/418, 438/424, 429, 433, 696; 257/E21.546, E29.001, 257/E21.476
See application file for complete search history.

(56) References Cited

U.S. PATENT DOCUMENTS

| | | | |
|---|---|---|---|
| 2005/0073007 A1* | 4/2005 | Chen et al. | 257/355 |
| 2006/0131647 A1* | 6/2006 | Meyer | 257/335 |
| 2007/0145489 A1* | 6/2007 | Yeh et al. | 257/370 |
| 2008/0203534 A1* | 8/2008 | Xu et al. | 257/577 |

\* cited by examiner

*Primary Examiner*—Thomas L Dickey  
*Assistant Examiner*—Fazli Erdem  
(74) *Attorney, Agent, or Firm*—Slater & Matsil, L.L.P.

(57) ABSTRACT

Semiconductor devices and methods of manufacture thereof are disclosed. In a preferred embodiment, a semiconductor device includes a workpiece having a buried layer disposed beneath a top portion of the workpiece. An isolation ring structure is disposed within the top portion of the workpiece extending completely through at least a portion of the buried layer, the isolation ring structure comprising a ring having an interior region. A diffusion confining structure is disposed within the interior region of the isolation ring structure. A conductive region is disposed within the top portion of the workpiece within a portion of the interior of the isolation ring structure, the conductive region comprising at least one dopant element implanted and diffused into the top portion of the workpiece. The diffusion confining structure defines at least one edge of the conductive region, and the conductive region is coupled to the buried layer.

27 Claims, 6 Drawing Sheets

SEMICONDUCTOR DEVICES AND METHODS OF MANUFACTURE THEREOF

TECHNICAL FIELD

The present invention relates generally to the fabrication of semiconductor devices, and more particularly to the formation of sinker contact structures in semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate or workpiece, and patterning the various layers using lithography to form circuit components and elements thereon.

The upper material layers of semiconductor devices typically comprise metallization layers that are used to interconnect various electrical devices and elements formed on an integrated circuit (IC). The metallization layers are typically formed in a back end of line (BEOL) of a semiconductor manufacturing process, for example. However, the lower layers of semiconductor devices do not typically contain metal, because some metals may contaminate semiconductive materials in some applications. The fabrication of lower levels of semiconductor devices that do not contain metal are often referred to as a front end of line (FEOL) of a semiconductor manufacturing process, for example. Structures that are referred to in the art as "sinker contacts" are often used to make electrical connection in the FEOL to devices formed on a semiconductor workpiece or substrate comprising a conductive buried layer, for example.

Sinker contacts are formed by implanting dopants into a substrate, and annealing or heating the substrate to drive the dopants deeper into the substrate. The dopants make the semiconductive material conductive, and thus sinker contacts may be used to make electrical contact to conductive buried layers in the substrate. However, since the lateral diffusion width is on the order of the vertical diffusion depth, conventional sinker contacts are typically quite large, comprising a width of tens of μm or greater in some applications, for example, requiring a large amount of real estate on an IC, which is costly and limits the amount that a semiconductor device may be scaled down in size. For example, to provide electrical contact to a 5 μm deep buried layer, a total sinker contact width after out-diffusion is typically on the order of about 15 μm, which is quite large in comparison to today's state of the art minimum semiconductor structures that may have a total width of less than about 100 nm.

Thus, what are needed in the art are improved sinker contacts for semiconductor devices and methods of manufacture thereof.

SUMMARY OF THE INVENTION

These and other problems are generally solved or circumvented, and technical advantages are generally achieved, by preferred embodiments of the present invention, which provide novel semiconductor devices and methods of manufacturing thereof.

In accordance with a preferred embodiment of the present invention, a semiconductor device includes a workpiece having a buried layer disposed beneath a top portion of the workpiece. An isolation ring structure is disposed within the top portion of the workpiece extending completely through at least a portion of the buried layer, the isolation ring structure comprising a ring having an interior region. A diffusion confining structure is disposed within the interior region of the isolation ring structure. A conductive region is disposed within the top portion of the workpiece within a portion of the interior of the isolation ring structure, the conductive region comprising at least one dopant element implanted and diffused into the top portion of the workpiece. The diffusion confining structure defines at least one edge of the conductive region, and the conductive region is coupled to the buried layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, in the formation of sinker contacts in semiconductor devices. Embodiments of the present invention may also be applied, however, to other electrical connection structures and methods of forming thereof in semiconductor devices.

Embodiments of the present invention provide novel semiconductor devices that comprise novel sinker contacts and surrounding isolation structures. A novel isolation structure referred to herein as a diffusion confining structure is formed proximate a sinker contact region to confine diffusion of dopant elements of the sinker contact. The diffusion confining structures may be formed entirely through a buried layer, with regions of the workpiece between the diffusion confining structures and an isolation ring structure left intact to provide electrical contact to the buried layer. In other embodiments, the diffusion confining structures are formed only partially through the buried layer, to provide electrical contact of the sinker contact to the buried layer, to be described further herein.

Figure 7:
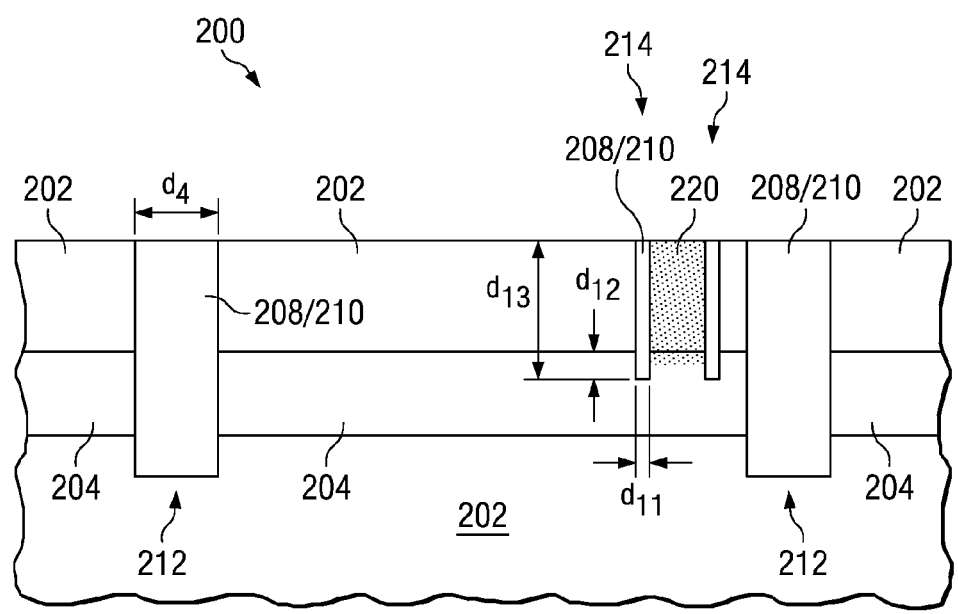
FIGS. 7 and 8 show a cross-sectional view and a top view, respectively, of another preferred embodiment of the present invention, wherein a diffusion confining structure comprises a second isolation ring structure formed within an interior of a first isolation ring structure, and wherein a sinker contact is formed in an interior of the second isolation ring structure.
Figure 8:
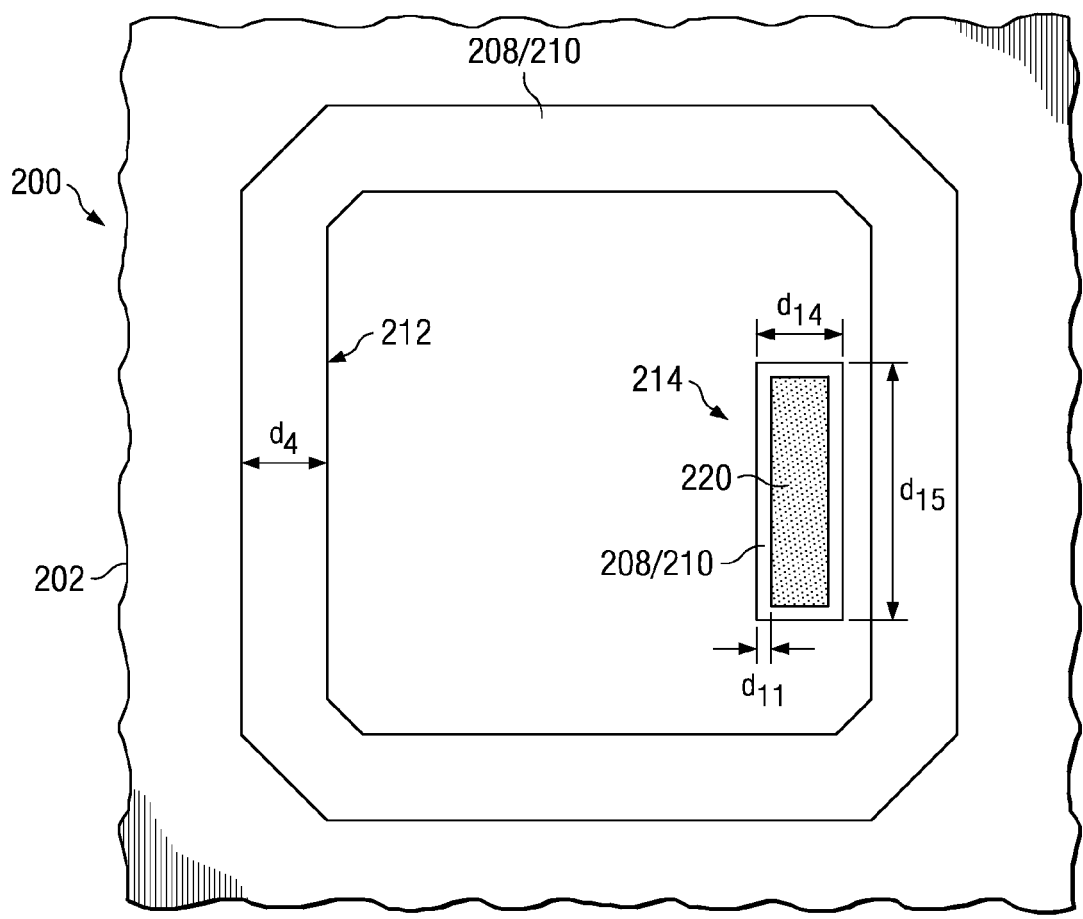

In accordance with embodiments of the present invention, a workpiece is provided that includes a buried layer disposed beneath a top portion of the workpiece. An isolation ring structure comprising the shape of a ring formed around the region where a sinker contact will be formed is disposed within the top portion of the workpiece extending completely through at least a portion of the buried layer. A diffusion confining structure is formed within the interior region of the isolation ring structure. The diffusion confining structure 114 or 314 may comprise a trench, as shown in FIGS. 1 through 4a, 5, 6, 9 and 10, a segmented trench, as shown in FIG. 4b, or the diffusion confining structure 214 may also comprise a trench ring structure, as shown in FIGS. 7 and 8, to be described further herein. A sinker contact or a conductive region is formed within the top portion of the workpiece within a portion of the interior of the isolation ring structure. The sinker contact or conductive region comprises at least one dopant element that is implanted and diffused into the top portion of the workpiece. The sinker contact is coupled to and makes electrical contact with the buried layer. The diffusion confining structure defines at least one edge of the sinker contact or conductive region, advantageously, also to be described further herein.

Figure 1:
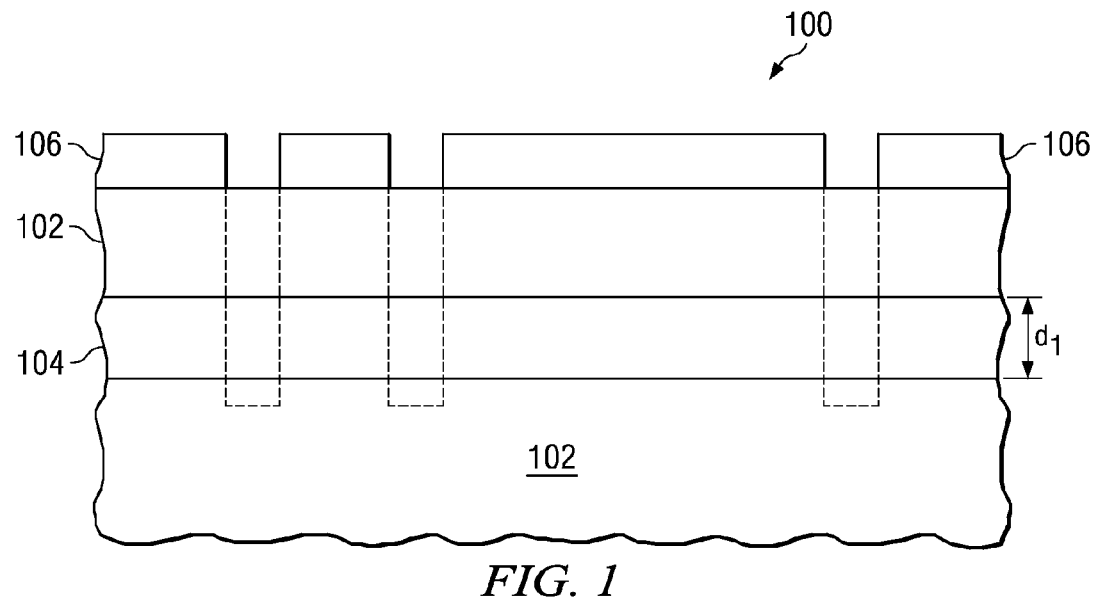
FIGS. 1 and 2 show cross-sectional views of a semiconductor device at various stages of manufacturing in accordance with an embodiment of the present invention, wherein an isolation ring structure and a diffusion confining structure comprising an isolation trench are formed in a workpiece.
Figure 2:
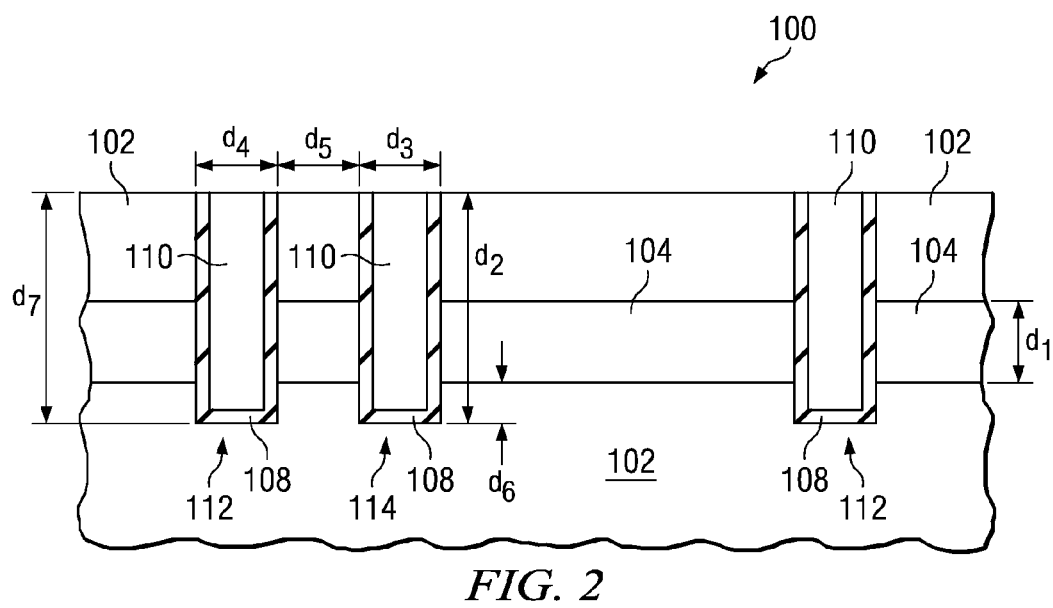

Preferred embodiments of the present invention will next be described with reference to FIGS. 1 through 6. FIGS. 1 and 2 show cross-sectional views of a semiconductor device 100 at various stages of manufacturing in accordance with a preferred embodiment. Referring first to FIG. 1, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate or germanium-on-insulator (GOI) substrate, as examples.

A buried layer 104 is formed in the workpiece 102, as shown in FIG. 1. The buried layer 104 preferably comprises a conductive layer that may be formed by implantation of dopants or in-situ deposition of a doped semiconductive material, as examples, although the buried layer 104 may be formed using other methods. The buried layer 104 may comprise a dimension $d_1$ or thickness of about 5 µm, for example, although the buried layer 104 may also comprise other dimensions. The buried layer 104 may be formed that has a pattern, for example, not shown (e.g., rectangular, angled, meandering, or other shapes).

A top portion of the workpiece 102 resides above the buried layer 104, as shown. The top portion of the workpiece 102 may be formed by epitaxial growth of a semiconductive material on top of an implanted buried layer, as an example. Another alternative of forming the buried layer 104 is to directly implant the buried layer 104 deep into the substrate or workpiece 102 using high-energy implantation, for example. The top portion of the workpiece 102 may comprise a thickness of about 5 µm, and may comprise a thickness of about 1 to 10 µm in some embodiments, for example, although alternatively, the top portion of the workpiece 102 may comprise other dimensions.

The buried layer 104 may comprise N doped silicon in some embodiments, for example, although in some applications, the buried layer 104 may comprise P doped silicon, as another example. The buried layer 104 may comprise a sheet layer that is heavily doped so that it is conductive. The buried layer 104 may be coupled to an active area (not shown in the drawings) of the workpiece 102. The active area may comprise a portion of a transistor, e.g. a bipolar transistor or drain extended MOS (DEMOS) transistor, a diode, capacitor, logic device, memory device, other circuit elements, or combinations thereof, as examples. The active area coupled to the buried layer 104 may be formed in the workpiece 102, e.g., before or after the manufacturing processing steps described herein. It is an object of the present invention to make electrical contact to the buried layer 104 by forming a sinker contact, for example, to be described further herein.

Next, a masking material 106 is formed over the workpiece 102. The masking material 106 may comprise a layer of photosensitive material such as a photoresist, for example. The masking material 106 may also comprise a hard mask and a layer of photoresist disposed over the hard mask, for example, not shown.

The masking material 106 is patterned using lithography, e.g., by exposure to light or radiation to transfer a pattern from a lithography mask (not shown) to the masking material 106, and the photosensitive material is developed. Exposed portions of the workpiece 102 are etched away using the patterned masking material 106 as mask, as shown in phantom in FIG. 1, patterning the workpiece 102 with a plurality of trenches. The etch process to form the trenches may comprise a wet or dry etch process, for example, and more preferably may comprise a reactive ion etch (RIE) process in some embodiments, for example. The etch process may be anisotropic, isotropic, or a combination thereof, for example. The plurality of trenches comprise patterns for an isolation ring structure 112 and a diffusion confining structure 114 shown in FIG. 2, for example.

Figure 4A:
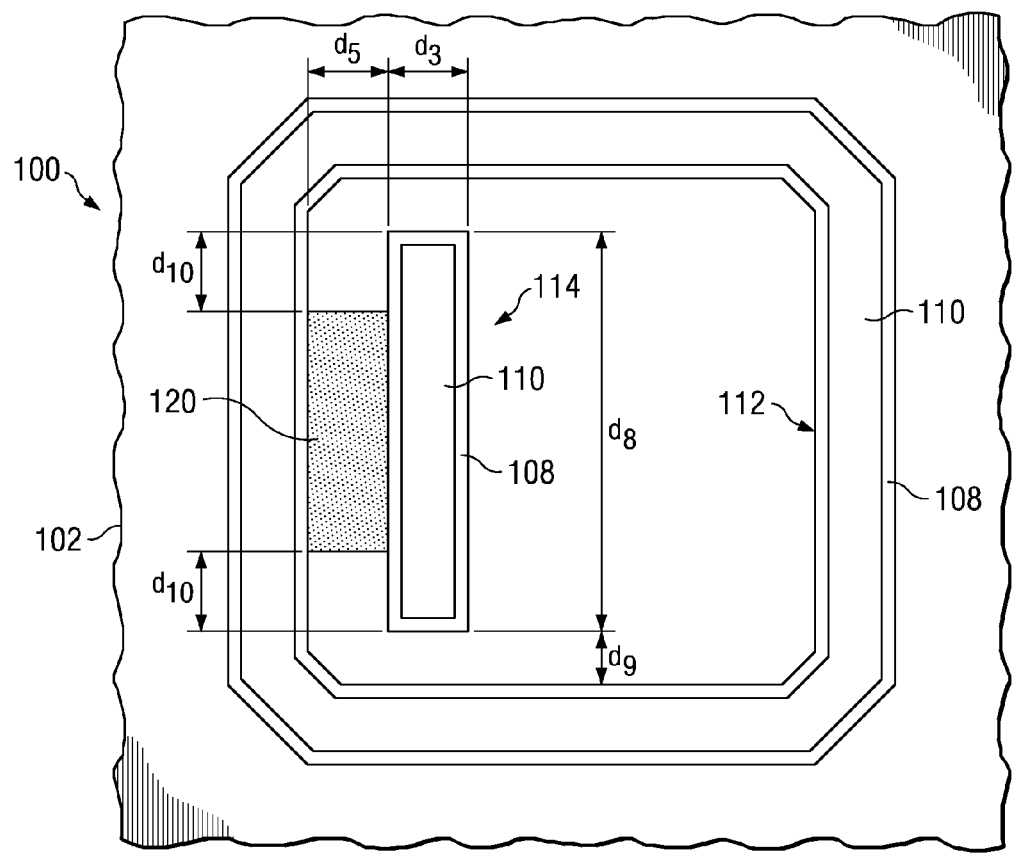
FIG. 4a shows a top view of the semiconductor device shown in FIG. 3 in accordance with an embodiment of the present invention, wherein the isolation trench of the diffusion confining structure is elongated yet spaced apart at the ends from the isolation ring structure.

The trenches may extend lengthwise, e.g., in and out of the paper as shown in FIG. 2 by about several µm to about 1 mm or greater, for example, as shown in a top view in FIG. 4a, wherein the trenches have been filled with a fill material 108/110. The trenches may extend in substantially straight lines as shown in FIG. 4a, or they may comprise arbitrary shapes or paths, e.g., they may be cornered or meandering. The trenches may comprise an L-shape, an S-shape, or other shapes across a surface of the workpiece 102. The trenches for the isolation ring structure 112 are preferably substantially ring-shaped, but may also be square, rectangular, oval, round, trapezoidal, hexagonal, or other shapes that encapsulate the diffusion confining structure 114 and sinker contact region, for example.

Preferably, the patterns for the isolation ring structure 112 and the diffusion confining structure 114 are formed simultaneously using a single etch process, and using a single masking material 106 and lithography mask, for example, although in other embodiments, the patterns for the isolation ring structure 112 and the diffusion confining structure 114 may alternatively be formed using two separate lithography processes, for example, not shown.

FIG. 2 shows a cross-sectional view of the semiconductor device 100 shown in FIG. 1 after the isolation ring structure 112 and the diffusion confining structure 114 have been filled with fill materials 108 and 110. The trenches for the isolation ring structure 112 and the diffusion confining structure 114 are preferably filled simultaneously using the same deposition and/or fill processes, for example. The isolation ring structure 112 and the diffusion confining structure 114 are preferably filled first with an insulating liner 108 and then the remainder of the trenches for the isolation ring structure 112 and the diffusion confining structure 114 are filled with a fill material 110 that may comprise a semiconductive material such as polysilicon or amorphous silicon in some embodiments, for example.

The optional liner 108 may comprise a nitride, an oxide, or combinations or multiple layers thereof, for example. The liner 108 may comprise a first layer of silicon dioxide and a second layer of silicon nitride disposed over the first layer of silicon dioxide, in some embodiments, for example. The liner 108 preferably comprises a thickness of about 100 nm or greater, and more preferably comprise a thickness of about 1 µm or less, for example, although alternatively, the liner 108 may comprise other dimensions, for example. The liner 108 is preferably substantially conformal, having the same thickness over all surfaces of the trenches, as shown.

Using a fill material 110 comprising the same material as the workpiece 102 may be advantageous in some applications to improve stress properties of the semiconductor device 100 structure, for example. Using a fill material 110 that is the same material as the workpiece 102 or has similar stress properties of the workpiece 102 is advantageous because the stress of the workpiece 102 is matched, for example. Alternatively, other materials may be used to fill the isolation ring structure 112 and the diffusion confining structure 114, for example.

As another example, the isolation ring structure 112 and the diffusion confining structure 114 may be filled with a liner 108 comprising an oxide or nitride, as examples, and then an insulating fill material 110 may be used to fill the remainder of the trenches. The fill material 110 may be formed using a high aspect ratio fill process (such as HARP™ by Applied Materials, Inc.), spin-on glass (SOG), FlowFill™ by Trikon, or tetra ethyl oxysilane (TEOS), as examples, although other insulators may also be used. The fill material 110 preferably comprises a dielectric material typically used for shallow trench isolation (STI) in semiconductor devices, for example, such as silicon dioxide. The liner 108 is optional; alternatively, only a fill material 110 comprising an insulator may be used to fill the trenches, for example. However, alternatively, other processes and insulating materials may be used to fill the trench. If an isolating liner 108 is used, the trench fill material 110 may also comprise a conductive material, such as polysilicon or amorphous silicon, which may advantageously reduce stress inside the deep trench structures 112 and 114, for example.

Dimension $d_2$ in FIG. 2 illustrates the depth and dimension $d_3$ illustrates the width of the diffusion confining structure 114 within the workpiece 102. Dimension $d_2$ may comprise about 20 µm, for example, although alternatively, dimension $d_2$ may comprise other dimensions. Dimension $d_3$ may comprise about 3 µm, for example, although alternatively, dimension $d_3$ may comprise other dimensions. Dimension $d_4$ illustrates the width of the isolation ring structure 112. Dimension $d_4$ may comprise about 3 µm, for example, although alternatively, dimension $d_4$ may comprise other dimensions.

Dimension $d_5$ illustrates the distance between the diffusion confining structure 114 and the isolation ring structure 112 at a point closest to the diffusion confining structure 114. Dimension $d_5$ may comprise about 2 to 5 µm, for example, although alternatively, dimension $d_5$ may comprise other dimensions. Dimension $d_6$ illustrates the depth of the diffusion confining structure 114 beneath the buried layer 104. Dimension $d_6$ may comprise about 5 µm or less, for example, although alternatively, dimension $d_6$ may comprise other dimensions. Dimension $d_7$ illustrates the total depth of the isolation ring structure 112. Dimension $d_7$ may comprise about 20 µm, for example, although alternatively, dimension $d_7$ may comprise other dimensions.

Dimension $d_4$ of the isolation ring structure 112 is also referred to herein as a first width (e.g., in the claims), and dimension $d_3$ of the diffusion confining structure 114 is also referred to herein as a second width. The second width $d_3$ is preferably substantially the same as the first width $d_4$ in the embodiments shown in FIGS. 1 through 6, for example. Thus, during the etch process, trenches are formed that have substantially the same depth for the isolation ring structure 112 and the diffusion confining structure 114. For example, dimension $d_7$ is also referred to herein as a first depth, and dimension $d_2$ is also referred to herein as a second depth, wherein the second depth $d_2$ is preferably substantially the same as the first depth $d_7$ in the embodiment shown in FIG. 2.

The isolation ring structure 112 and the diffusion confining structure 114 are formed within a top portion of the workpiece 102 and preferably extend completely through at least a portion of the buried layer 104, as shown. The isolation ring structure 112 and the diffusion confining structure 114 preferably also extend completely through the buried layer 104 and partially into a portion of the workpiece 102 beneath the buried layer 104 by dimension $d_6$, as shown in FIG. 2.

After the liner 108 and fill material 110 are formed, a chemical mechanical polish (CMP) process and/or an etch process may be used to remove the liner 108 and fill material 110 from over the top surface of the workpiece 102, leaving the structure shown in FIG. 2.

Figure 3:
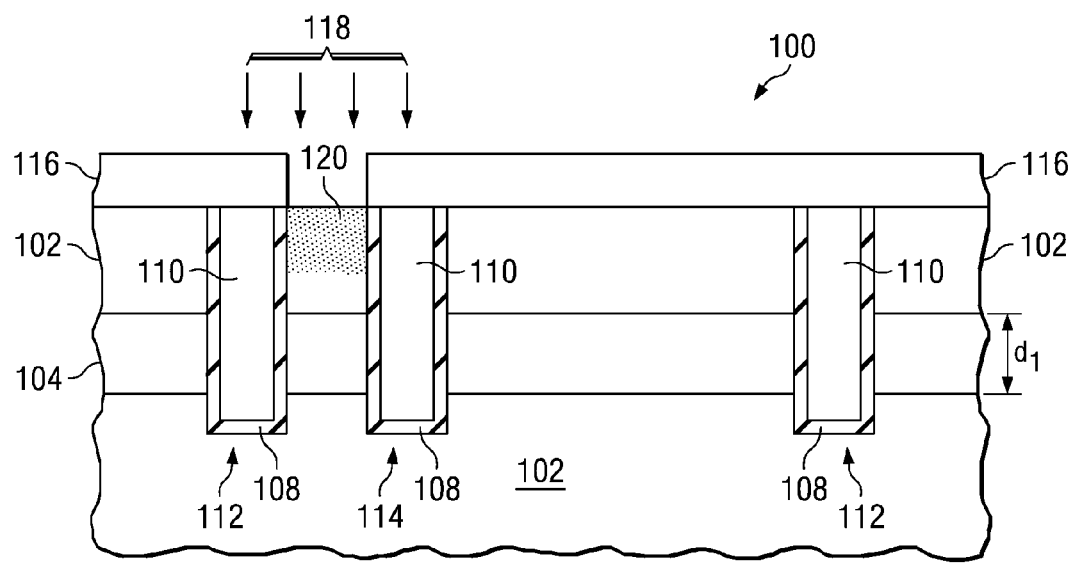
FIG. 3 shows the semiconductor device shown in FIG. 2 after the workpiece is masked and a dopant element is implanted into the top surface of the workpiece in a sinker contact region.
Figure 4B:
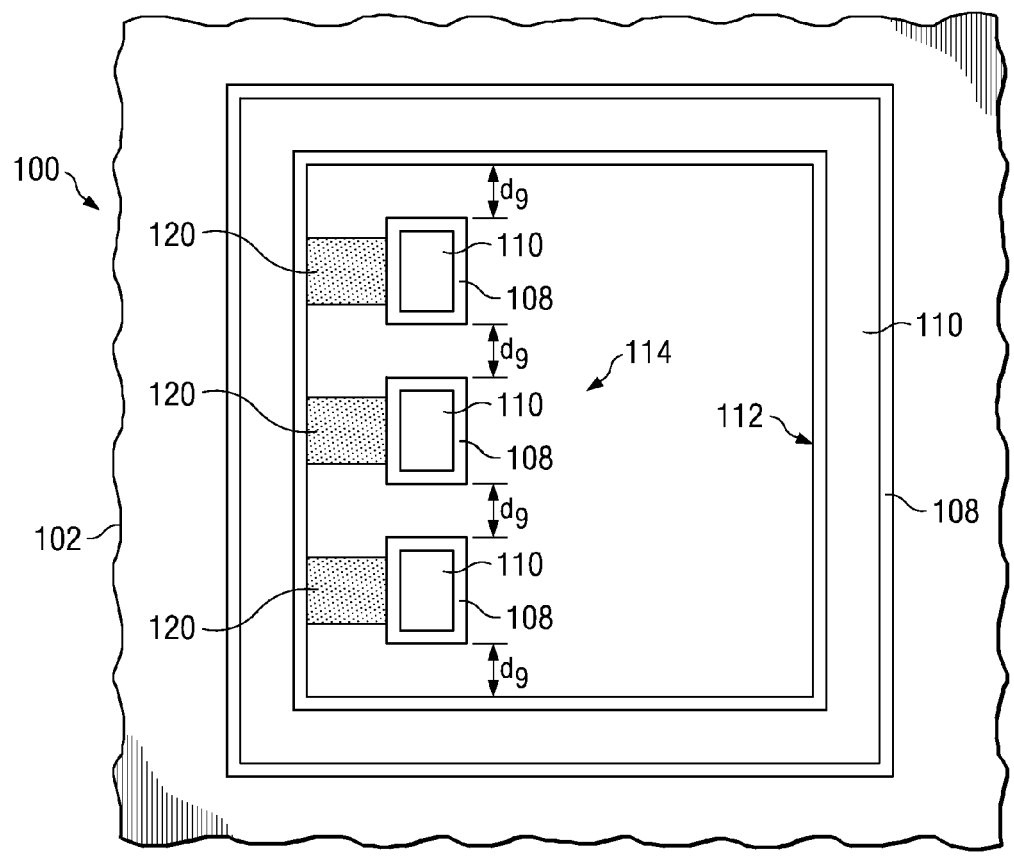
FIG. 4b shows a top view of the semiconductor device shown in FIG. 3 in accordance with another embodiment of the present invention, wherein the isolation trench of the diffusion confining structure is segmented.

FIG. 3 shows the semiconductor device 100 of FIG. 2 after the workpiece 102 is masked with a masking material 116 and a dopant element 118 is implanted within the top portion of the workpiece 102 into a portion of the interior of the isolation ring structure 112. The dopant element 118 preferably comprises at least one dopant element; e.g., the dopant element 118 may comprise a plurality of dopant elements. The dopant element 118 is preferably implanted into the top surface of the workpiece 102 in a sinker contact region defined by an interior wall of the isolation ring structure 112 and one side of the diffusion confining structure 114, for example, as shown in FIG. 3, forming a sinker contact 120.

The dopant element 118 preferably comprises an N type material in some embodiments, although alternatively, the dopant element 118 may also comprise a P type material, for example. The dopant element 118 may comprise As, P, B, or other dopants or elements typically used in implantation processes to make a semiconductive material such as the workpiece 102 more conductive, for example.

FIG. 4a shows a top view of the semiconductor device 100 shown in FIG. 3 in accordance with an embodiment of the present invention. The isolation ring structure 112 comprises a ring shape and has an interior region. Note that in this embodiment, the novel diffusion confining structure 114 preferably comprises an elongated isolation trench having a length or dimension $d_8$. Dimension $d_8$ may comprise about 5 to 100 μm or less, for example, although alternatively, dimension $d_8$ may comprise other dimensions. The isolation trench of the diffusion confining structure 114 is preferably spaced apart at the ends of the isolation trench from the isolation ring structure 112 by a dimension $d_9$, as shown. Dimension $d_9$ may comprise about 3 μm, for example, although alternatively, dimension $d_9$ may comprise other dimensions.

Preferably, the dopant element 118 is implanted into the workpiece 102 by a dimension $d_{10}$ that is spaced apart from the ends of the diffusion confining structure 114. Dimension $d_{10}$ may comprise about 3 μm or greater, for example, although alternatively, dimension $d_{10}$ may comprise other dimensions. Dimension $d_{10}$ is preferably greater than dimension $d_9$ in some embodiments, for example. The dimension $d_{10}$ is preferably selected or designed such that after the diffusion of the dopant element 118 and after drive-in of the dopant element 118 of the sinker contact 120, the dopant element 118 does not reach the right side of the diffusion confining structure 114. The dopant element 118 preferably does not exceed the confined part of the sinker contact 120, e.g., the active region of the workpiece 102 to the right of the diffusion confining structure 114 in FIG. 4a. In other words, the implantation area of the sinker contact 120 is preferably smaller than the diffusion confining structure 114 by a distance about equal to the diffusion length during the subsequent sinker contact 120 dopant element 118 drive-in, shown in FIG. 5 (to be described further herein).

In the embodiment shown in a top view in FIG. 4a, the diffusion confining structure 114 comprises an isolation trench that extends from proximate a first side of the isolation ring structure 112 to proximate a second side of the isolation ring structure 112. The isolation trench of the diffusion confining structure 114 comprises a first end and a second end opposite the first end, wherein the first end and the second end of the isolation trench are spaced apart from the isolation ring structure 112 by a dimension $d_9$, allowing electrical connection of the sinker contact 120 to the buried layer 104 (see FIG. 5) proximate the first end and the second end of the isolation trench of the diffusion confining structure 114.

In another embodiment, shown in FIG. 4b, the diffusion confining structure 114 preferably is segmented, comprising an interrupted diffusion confining structure 114, for example. The trenches for the diffusion confining structure 114 in this embodiment are preferably formed by forming an isolation trench within the interior region of the isolating ring structure that comprises a plurality of trench segments. The trench structure of the diffusion confining structure 114 is preferably interrupted with material comprised of the top portion of workpiece 102, the buried layer 104, and a portion of the lower portion of the workpiece 102, wherein the width of the workpiece 102 and buried layer 104 in the space between the trenches comprises a dimension similar or equal to the spacings $d_9$ at the end of the trench segments, for example, as shown. Segmenting the trench of the diffusion confining structure 114 achieves a lower resistance for the connection of the sinker contact 120 to the buried layer 104 to the right of the diffusion confining structure 114 in FIG. 4b, for example.

In the embodiment shown in FIG. 4b, the implanted sinker contact 120 regions are preferably slightly smaller (e.g., by the diffusion length of the dopant element 118) than the trench segments of the diffusion confining structure 114. The diffusion confining structure 114 preferably comprises a plurality of regions of the diffusion confining structure 114, and the sinker contact 120 comprises a plurality of sinker contact 120 regions. The plurality of sinker contact 120 regions each provide electrical connection of the sinker contact 120 to the buried layer 104, providing an improved, lower ohmic electrical contact of the sinker contact 120 to the buried layer 104.

Figure 5:
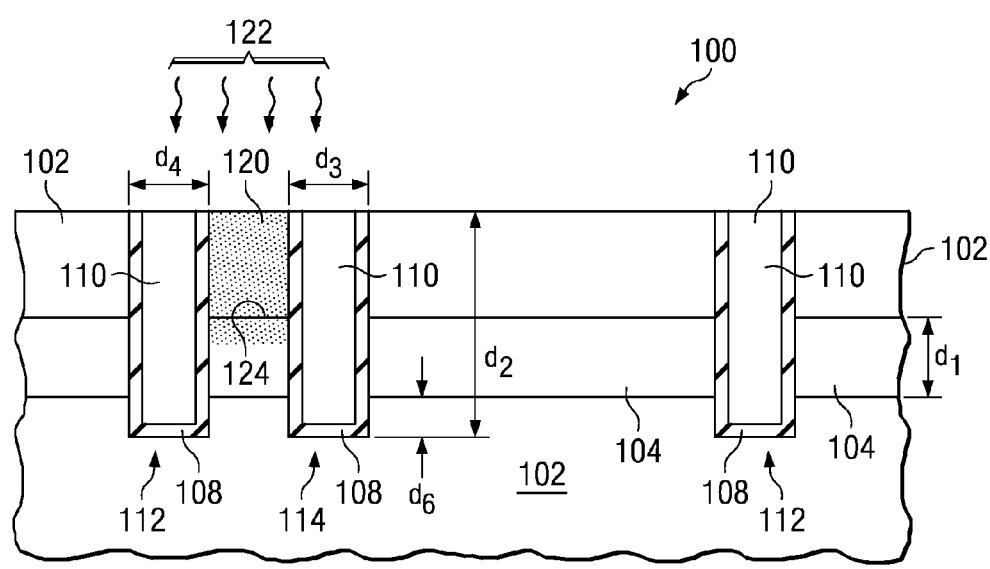
FIG. 5 illustrates the semiconductor device of FIG. 4a or 4b during an anneal step that causes diffusion of the dopant element into the workpiece, forming a sinker contact that makes electrical contact to a buried layer of the workpiece.

The workpiece 102 is then annealed to drive in the dopant element 118, as shown in FIG. 5, using an anneal process 122. The workpiece 102 may be heated to a temperature of about 1,000 degrees C. or greater for about an hour or more, although other temperatures and time durations may also be used for the anneal process 122. The anneal process or step 122 causes diffusion of the dopant element 118 into the top surface of the workpiece 102, forming a sinker contact 120 that makes electrical contact to and is coupled to the buried layer 104 within the workpiece 102. A portion of the dopant element 118 may diffuse into a top portion of the buried layer 104, beneath the top surface 124 of the buried layer 104, for example, as shown. The sinker contact 120 is also referred to herein as a conductive region, for example.

The diffusion confining structure 114 confines lateral diffusion of the dopant element 118 within the top portion of the workpiece 102 during the anneal process 122 on at least one side, e.g., on the side of the isolation trench of the diffusion confining structure 114 in the embodiment shown in a top view in FIG. 4a, defining an edge of the sinker contact 120. The opposite edge of the sinker contact 120 is defined by the interior wall of the isolation ring structure 112. In other words, the diffusion confining structure 114 comprises an isolation trench, wherein the isolation trench defines a first edge of the conductive region 120, and the isolation ring structure 112 defines a second edge of the conductive region 120. The embodiment shown in FIG. 4b in a top view also defines a first edge of the conductive region 120 in the shape of a plurality of segments.

Figure 6:
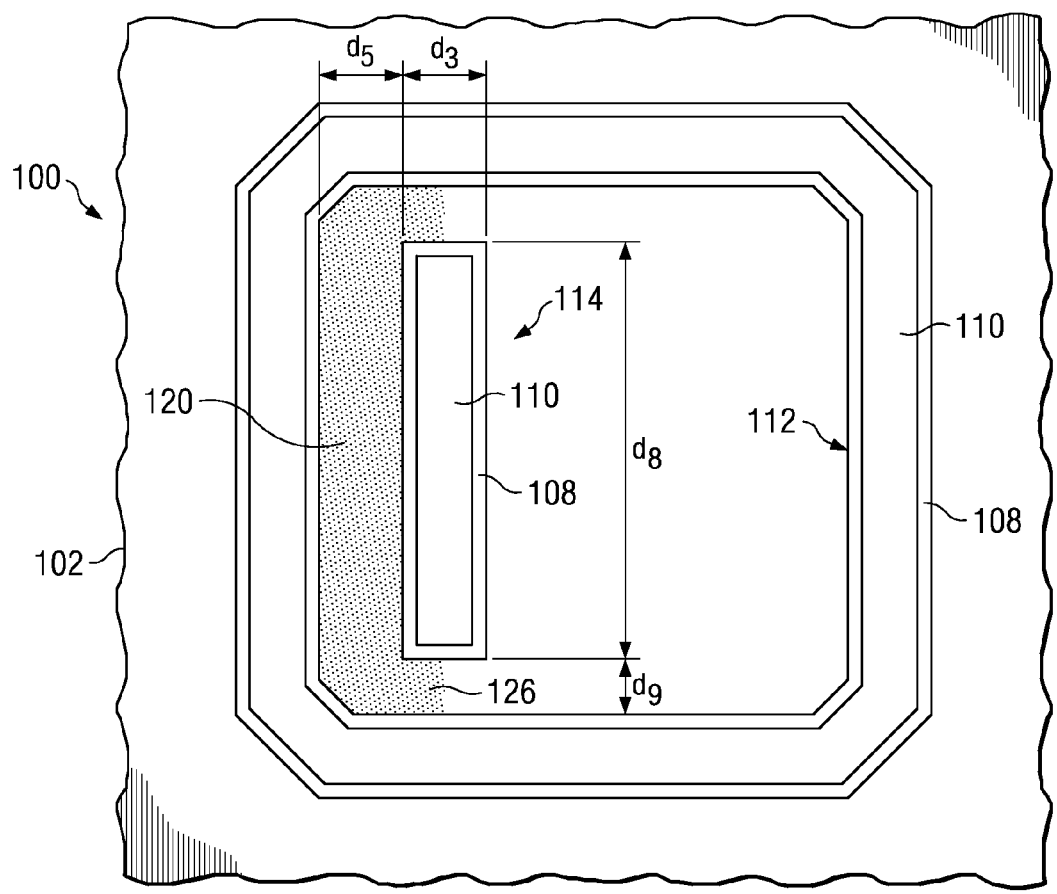
FIG. 6 shows a top view of the embodiment shown in FIGS. 4a and 5, illustrating that the sinker contact makes electrical contact to the buried layer proximate the ends of the isolation trenches of the diffusion confining structure.

FIG. 6 shows a top view of the embodiment shown in FIGS. 4a and 5, illustrating that the sinker contact 120 makes electrical contact to the buried layer 104 at the ends of the isolation trenches of the diffusion confining structure 114. Because the ends of the isolation trenches of the diffusion confining structure 114 are open, e.g., the workpiece 102 remains intact between the ends of the diffusion confining structure 114 and the isolation ring structure 112, diffusion of the dopant element 118 reaches beyond the ends of the isolation trenches of the diffusion confining structure 114, as shown at 126. Electrical contact of the sinker contact 120 104 confined by the diffusion confining structure 114 to the buried layer 104 on the right side of 110 is made around the ends or edges of the diffusion confining structure 114. In the embodiment shown in FIG. 4b, comprising the segmented diffusion confining structure 114, electrical contact of the sinker contact 120 to buried layer 104 is made at the ends and also through the spaces between the segments of the diffusion confining structure 114, for example. The ends of the isolation trenches of the diffusion confining structure 114 preferably do not extend fully to the isolation ring structure 112 in the embodiments shown in FIGS. 4a and 4b, for example.

In the embodiment shown in FIGS. 1 through 4a, 5, and 6, the novel diffusion confining structure 114 confines diffusion of the sinker contact 120 dopant element 118 in one dimension, e.g., defining the shape of the sinker contact 120 on one side. In the embodiment shown in FIG. 4b, the diffusion confining structure 114 confines diffusion of the sinker contact 120 dopant element 118 in segments, also on one side. In other embodiments of the present invention, diffusion confining structures are used that further define the shape of the sinker contact 120 in two dimensions.

FIGS. 7 and 8 show a cross-sectional view and a top view, respectively, of another preferred embodiment of the present invention, wherein a diffusion confining structure 214 comprises a second isolation ring structure 214 formed within an interior of a first isolation ring structure 212, and wherein a sinker contact 220 is formed in the interior of the second isolation ring structure 214. Like numerals are used for the various elements that were described in FIGS. 1 through 6. To avoid repetition, each reference number shown in FIGS. 7 and 8 is not described again in detail herein. Rather, similar materials x02, x04, x06, x08, etc . . . are preferably used for the various material layers shown as were described for FIGS. 1 through 6, where x=1 in FIGS. 1 through 6 and x=2 in FIGS. 7 and 8. As an example, the preferred and alternative materials and dimensions described for the liner 108 and fill material 110 in the description for FIGS. 1 through 6 are preferably also used for the liner 208 and fill material 210 shown in FIG. 7.

In this embodiment, the isolation ring structure 212 comprises a first isolation ring structure, and the diffusion confining structure 214 comprises a second isolation ring structure, the second isolation ring structure 214 being disposed within the first isolation ring structure 212. The conductive region 220 or sinker contact is formed in and disposed within the second isolation ring structure 214. For example, the at least one dopant element is implanted within the top portion of the workpiece 202 into an interior of the second isolation ring structure 214.

Note that in this embodiment, in order to make electrical contact with the buried layer 204, the diffusion confining structure 214 preferably does not extend completely through the buried layer 204. Rather, the diffusion confining structure 214 preferably extends partially through the buried layer 204, as shown at dimension $d_{12}$ in FIG. 7. Dimension $d_{12}$ may comprise about 2 μm or less, for example, although alternatively, dimension $d_{12}$ may comprise other dimensions.

The etch process to form the trenches for the isolation ring structure 212 and diffusion confining structure 214 preferably comprises a RIE etch in this embodiment, for example, and the phenomena of RIE lag may be used to form the trenches. In a RIE etch process, narrow openings etch slower and result in shallower trenches than wide openings. Therefore, a single RIE etch process may advantageously be used to form both deep and shallow trenches, by selecting trench openings or widths that will achieve the desired depth of the trenches.

For example, the diffusion confining structure 214 preferably comprises a width comprising a dimension $d_{11}$ that is preferably less than the width $d_4$ of the isolation ring structure 212, as shown. Dimension $d_{11}$ may comprise about 2 μm or less, for example, although alternatively, dimension $d_{11}$ may comprise other dimensions. Note that dimension $d_{11}$ is also referred to herein as a second width (e.g., in the claims) and dimension $d_4$ is also referred to herein as a first width, the second width being less than the first width, in this embodiment. The diffusion confining structure 214 preferably has a narrower second width $d_{11}$ than the first width $d_4$ of the isolation ring structure.

A shallower depth $d_{13}$ of the diffusion confining structure 214 may be achieved using a RIE etch, which results in a shallower depth $d_{13}$ of the diffusion confining structure 214 than the depth of the isolation ring structure 212 due to the narrower width $d_{11}$ of the diffusion confining structure 214. RIE lag of the RIE process causes the isolation ring structure 212 to be formed deeper into the workpiece 202 than the diffusion confining structure 214. In other words, the isolation ring structure 212 comprises a first depth (not labeled in FIG. 7; see FIG. 2 at dimension $d_7$) within the workpiece 202, and the diffusion confining structure 214 comprises a second depth or dimension $d_{13}$ within the workpiece 202, the second depth $d_{13}$ being less than the first depth $d_7$. Dimension $d_{13}$ may comprise about 11 μm or less, for example, although alternatively, dimension $d_{13}$ may comprise other dimensions. Due to RIE lag, the narrower trenches of the diffusion confining structure 214 do not form as deeply as the wider trenches for the isolation ring structure 212. Thus, the narrower trenches of the diffusion confining structure 214 form a narrow isolating ring that makes contact just within the buried layer 204, so that the diffusion confining structure 214 advantageously completely encapsulates the sinker contact 220.

The diffusion confining structure 214 is used to define at least two edges of the conductive region or sinker contact 220 in this embodiment. In the embodiment shown, for example, because contact is made on all four sides of the sinker contact 220 by the diffusion confining structure 214, diffusion of dopant elements from the sinker contact 220 is confined on all sides and is bounded on all edges of the sinker contact 220 by the isolation ring structure 212.

The isolation ring structure 212 preferably extends completely through the buried layer 204 and partially into a portion of the workpiece 202 beneath the buried layer 204 in this embodiment, and the diffusion confining structure 214 preferably extends partially through the buried layer 204, as shown in FIG. 7.

FIG. 8 shows a top view of the semiconductor device 200 shown in FIG. 7. The ring shape of the diffusion confining structure 214 is visible in the view of FIG. 8, for example. The diffusion confining structure 214 may comprise a width in the top view or dimension $d_{14}$ of about 5 μm or greater, for example, although alternatively, dimension $d_{14}$ may comprise other dimensions. The diffusion confining structure 214 may comprise a length or dimension $d_{15}$ of about 5 μm or less, for example, although alternatively, dimension $d_{15}$ may comprise other dimensions.

Figure 9:
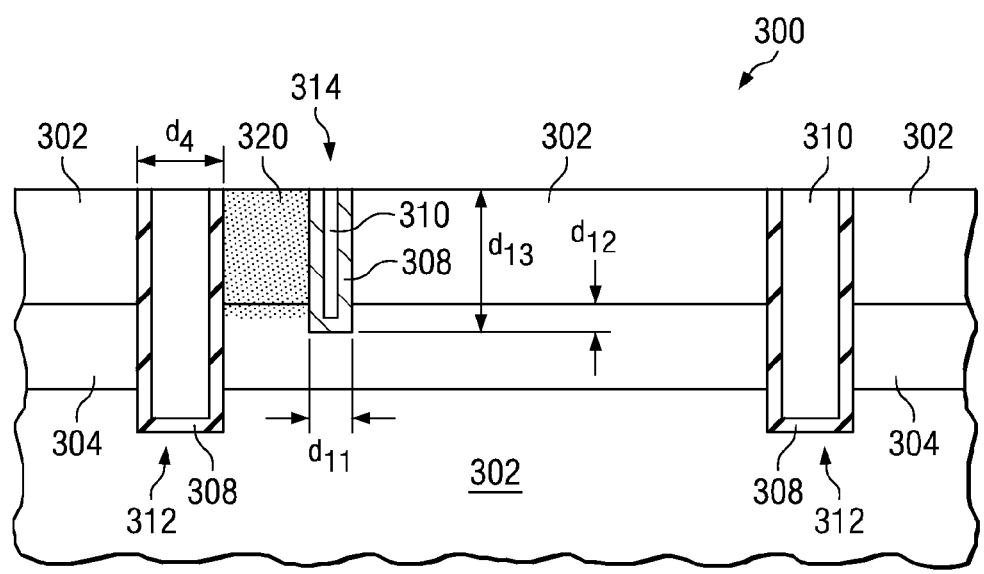
FIGS. 9 and 10 show a cross-sectional view and a top view, respectively, of another preferred embodiment of the present invention, wherein a diffusion confining structure comprises an isolation trench that extends partially through the buried layer and completely from one side to another side of the isolation ring structure.
Figure 10:
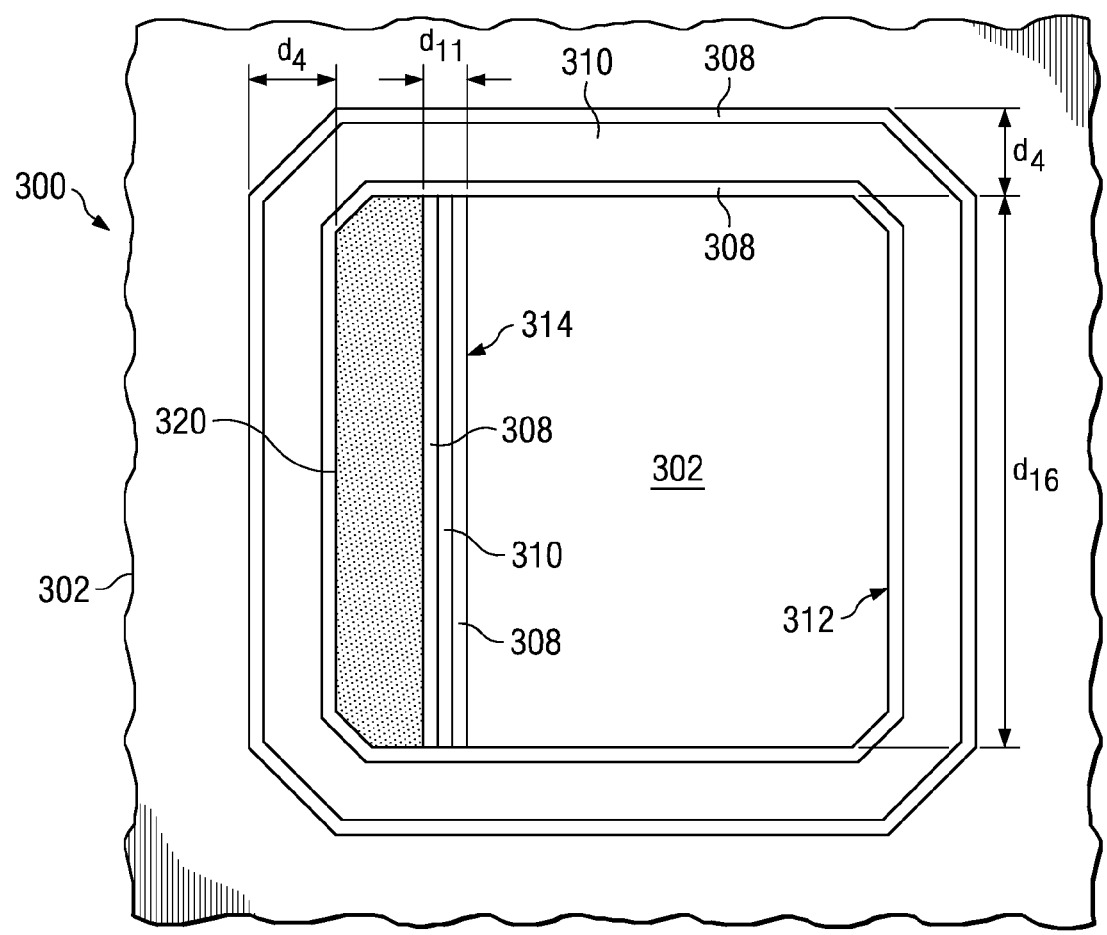

FIGS. 9 and 10 show a cross-sectional view and a top view, respectively, of another preferred embodiment of the present invention, wherein a diffusion confining structure 314 comprises an isolation trench that extends partially through the buried layer 304 and completely from one side to another of the isolation ring structure 312. Again, like numerals are used to describe FIGS. 9 and 10 that were used to describe the previous drawings, and to avoid repetition, each element shown in FIGS. 9 and 10 is not described in detail herein again.

In this embodiment, the diffusion confining structure 314 comprises a trench that extends completely from a first side of the isolation ring structure 312 to a second side of the isolation ring structure 312. However, to provide electrical contact between the buried layer 304 and the sinker contact 320, the isolation trenches that comprise the diffusion confining structure 314 preferably extend only partially into the buried layer 304 so that electrical contact may be made to other regions of the buried layer 304 (e.g., to the right of the isolation trenches 314 shown in FIGS. 9 and 10).

The diffusion confining structure 314 is used to define at least two edges of the conductive region or sinker contact 320 in this embodiment. Because contact is made completely to either side of the isolation ring structure 312, diffusion of dopant elements from the sinker contact 320 is confined on three sides by the isolation ring structure 312, and diffusion is confined on one side or edge by the diffusion confining structure 314. The length or dimension $d_{16}$ of the diffusion confining structure 314 may comprise about 5 to 100 μm, for example, although alternatively, dimension $d_{16}$ may comprise other dimensions.

In this embodiment, as in the embodiment shown in FIGS. 7 and 8, the isolation ring structure 312 comprises a dimension $d_4$ comprising a first width, and the diffusion confining structure 314 comprises a dimension $d_{11}$ also referred to herein as a second width, the second width $d_{11}$ being less than the first width $d_4$. Because the diffusion confining structure 314 is narrower than the isolation ring structure 312, if the etch process to form the trenches for the isolation ring structure 312 and the diffusion confining structure 314 comprise a RIE process, which is preferable, RIE lag of the RIE process advantageously causes the isolation ring structure 312 to be formed deeper into the workpiece 302 than the diffusion confining structure 314. Because the diffusion confining structure 314 is narrower, the trenches are not formed completely through the buried layer 304 so that electrical contact is made by the sinker contact 320 to the buried layer 304. Thus, the isolation ring structure 312 comprises a first depth (dimension $d_7$ shown in FIG. 2) within the workpiece 302, and the diffusion confining structure 314 comprises a dimension $d_{13}$, also referred to herein as a second depth $d_{13}$, within the workpiece, the second depth $d_{13}$ being less than the first depth $d_7$.

As in the embodiment shown in FIGS. 7 and 8, the isolation ring structure 312 preferably extends completely through the buried layer 304 and partially into a portion of the workpiece 302 beneath the buried layer 304, to ensure adequate isolation from adjacent devices in the workpiece 302, for example, not shown. The diffusion confining structure 314 preferably extends only partially through the buried layer 304 to ensure electrical contact with the buried layer 304, as shown at dimension $d_{12}$.

Embodiments of the present invention are beneficial when used to form sinker contacts 120, 220, and 320, e.g., in bipolar devices. For example, the sinker contacts 120, 220, and 320 may be used to make electrical contact to a buried layer 104, 204, or 304 that functions as a highly doped sub-collector used in a bipolar transistor. Another example of an application in which embodiments of the present invention may be implemented is in smart power technologies, where a buried layer 104, 204, or 304 may provide high voltage isolation from the substrate 102, 202, or 302. In such applications, the buried layer 104, 204, or 304 needs to be electrically connected by a sinker contact 120, 220, or 320, for example. Another example of an application in which the novel sinker contacts 120, 220, and 320 of embodiments of the present invention may be implemented in, which is often found in smart power technologies, for example, is in vertical drain-extended MOS transistors, wherein an extended drain is formed vertically in the epitaxy on top of a buried layer 104, 204, or 304. In such applications, the sinker contact 120, 220, or 320 may function directly as a drain contact, for example. Alternatively, embodiments of the present invention may be implemented in other applications.

In the semiconductor devices 100, 200, and 300 shown in the drawings, a conductive line, a conductive pad, or a contact may be formed or disposed over and adjacent to the conductive region or sinker contact 120, 220, and 320, wherein the conductive region 120, 220, and 320 provides electrical connection of the conductive line, conductive pad, or contact to an active area of the workpiece 102, 202, and 302, for example.

Embodiments of the present invention achieve technical advantages by providing novel structures for sinker contacts 120, 220, and 320 and novel methods of manufacture thereof. The isolation ring structures 112, 212, and 312 may be made smaller, with the use of the novel diffusion confining structures 114, 214, and 314 within the isolation ring structures 112, 212, and 312 in accordance with embodiments of the present invention. The width of the isolation ring structures 112, 212, and 312 may be reduced in semiconductor device designs, so that the surface area may be used for active areas and other devices and components, rather than for sinker contact areas, advantageously. Smaller isolation ring structures 112, 212, and 312 may be used, wherein the isolation ring structures are smaller and require less space, yet still effectively isolate the sinker contacts 120, 220, and 320 from adjacent devices of the workpiece 102, 202, and 302. Furthermore, adjacent devices in the workpiece 102, 202, and 302 may be placed closer to the sinker contacts 120, 220, and 320 because the diffusion confining structures 114, 214, and 314 and the isolation ring structures 112, 212, and 312 provide trench isolation to adjacent devices. Thus, semiconductor devices 100, 200, and 300 may be scaled down further in size in accordance with embodiments of the present invention.

The widths and lateral sizes of sinker contacts 120, 220, and 320 may also be decreased, e.g., by controlling and limiting the width of the sinker contact 120, 220, and 320 diffusion using the novel diffusion confining structures 114, 214, and 314 described herein. Implementing the diffusion confining structures 114, 214, and 314 in a semiconductor device 100, 200, and 300 allows for smaller sinker contacts 120, 220, and 320 to be formed. Sinker contacts 120, 220, and 320 comprising a width of a few μm or less may be achieved in some applications in accordance with embodiments of the present invention, for example Advantageously, the diffusion confining structures 114, 214, and 314 are preferably formed simultaneously with the formation of the isolation ring structures 112, 212, and 312, so that additional lithography masks, lithography exposure steps, development steps, etch steps, and/or deposition steps, are not required to form the novel diffusion confining structures 114, 214, and 314. Thus, the novel diffusion confining structures 114, 214, and 314 and sinker contacts 120, 220, and 320 are easily and inexpensively implementable in manufacturing process flows, for example.

RIE lag of a RIE etch process used to form trenches for the isolation ring structures 112, 212, and 312 and diffusion confining structures 114, 214, and 314 may advantageously be utilized to achieve a desired depth of the diffusion confining structures 114, 214, and 314, by selecting widths of the trenches for the diffusion confining structures 114, 214, and 314 that will achieve the desired depth of the diffusion confining structures 114, 214, and 314 during the particular RIE process used to form the isolation ring structures 112, 212, and 312, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:

providing a workpiece having a buried layer disposed therein;

forming an isolation ring structure within a top portion of the workpiece, the isolation ring structure extending completely through at least a portion of the buried layer, the isolation ring structure comprising a ring having an interior region;

forming a diffusion confining structure within the interior region of the isolation ring structure;

implanting at least one dopant element within the top portion of the workpiece into a portion of the interior region of the isolation ring structure; and heating the workpiece, causing the at least one dopant element to diffuse within the top portion of the workpiece and form a conductive region, the conductive region being coupled to the buried layer, wherein the diffusion confining structure confines lateral diffusion of the at least one dopant element within the top portion of the workpiece on at least one side.

2. The method according to claim 1, wherein forming the diffusion confining structure comprises forming a trench within the isolation ring structure, and disposing an insulating material within the trench; and wherein implanting the at least one dopant element within the top portion of the workpiece comprises implanting the at least one dopant element between the trench and a side of the isolation ring structure.

3. The method according to claim 2, wherein forming the diffusion confining structure comprises forming an insulating liner within the trench, and forming a semiconductive material over the insulating liner within the trench.

4. The method according to claim 1, wherein forming the isolation ring structure comprises forming a first isolation ring structure, wherein forming the diffusion confining structure comprises forming a second isolation ring structure, the second isolation ring structure being disposed within the first isolation ring structure, wherein implanting the at least one dopant element within the top portion of the workpiece into the portion of an interior of the first isolation ring structure comprises implanting the at least one dopant element into an interior of the second isolation ring structure.

5. The method according to claim 1, wherein forming the isolation ring structure and forming the diffusion confining structure comprise forming a masking material over the workpiece, patterning the masking material with a pattern for the isolation ring structure and the diffusion confining structure, etching away portions of the workpiece using the masking material as a mask, and removing the masking material.

6. The method according to claim 1, wherein forming the isolation ring structure and forming the diffusion confining structure comprise forming the isolation ring structure and the diffusion confining structure simultaneously using a single etch process.

7. A method of forming a sinker contact for a semiconductor device, the method comprising:

providing a workpiece having a buried layer disposed therein, the buried layer being conductive and being coupled to an active area of the workpiece;

forming an isolation ring structure within a top portion of the workpiece, the isolation ring structure extending completely through at least a portion of the buried layer, the isolation ring structure comprising a ring having an interior region;

forming a diffusion confining structure within the interior region of the isolation ring structure;

implanting at least one dopant element within the top portion of the workpiece into a portion of the interior region of the isolation ring structure; and heating the workpiece, causing the at least one dopant element to diffuse within the top portion of the workpiece and form the sinker contact, the sinker contact being coupled to the buried layer, wherein the diffusion confining structure confines lateral diffusion of the at least one dopant element within the top portion of the workpiece on at least one side, defining at least one edge of the sinker contact, and wherein the isolation ring structure isolates the sinker contact from an adjacent device of the workpiece.

8. The method according to claim 7, wherein the diffusion confining structure is narrower than the isolation ring structure, wherein the isolation ring structure and the diffusion confining structure are formed using a single etch process that comprises a reactive ion etch (RIE) process, and wherein RIE lag of the RIE process causes the isolation ring structure to be formed deeper into the workpiece than the diffusion confining structure.

9. The method according to claim 8, wherein forming the isolation ring structure comprises forming an isolation ring structure that extends completely through the buried layer and partially into a portion of the workpiece beneath the buried layer, and wherein forming the diffusion confining structure comprises forming a diffusion confining structure that extends partially through the buried layer.

10. The method according to claim 7, wherein forming the diffusion confining structure comprises forming an isolation trench that extends from proximate a first side of the isolation ring structure to proximate a second side of the isolation ring structure, the isolation trench comprising a first end and a second end opposite the first end, wherein the first end and the second end of the isolation trench are spaced apart from the isolation ring structure, allowing electrical connection of the sinker contact to the buried layer proximate the first end and the second end of the isolation trench.

11. The method according to claim 10, wherein forming the isolation trench comprises forming an isolation trench that comprises a plurality of trench segments.

12. The method according to claim 10, wherein forming the isolation ring structure comprises forming an isolation ring structure having a first width and a first depth, and wherein forming the diffusion confining structure comprises forming an isolation ring structure having a second width and a second depth, wherein the first depth is substantially the same as the second depth, and wherein the first width is substantially the same as the second depth, and wherein the first depth and the second depth extend completely through the buried layer and partially into a portion of the workpiece beneath the buried layer.

13. The method according to claim 7, wherein forming the diffusion confining structure comprises forming an isolation trench that extends completely from a first side of the isolation ring structure to a second side of the isolation ring structure, wherein forming the isolation ring structure comprises forming an isolation ring structure that extends completely through the buried layer and partially into a portion of the workpiece beneath the buried layer, and wherein forming the isolation trench of the diffusion confining structure comprises forming an isolation trench that extends partially through the buried layer.

14. The method according to claim 7, wherein forming the isolation ring structure comprises forming a first isolation ring structure, wherein forming the diffusion confining structure comprises forming a second isolation ring structure, the second isolation ring structure being disposed within the first isolation ring structure, wherein implanting the at least one dopant element comprises implanting the at least one dopant element within the second isolation ring structure, wherein forming the first isolation ring structure comprises forming an isolation ring structure that extends completely through the buried layer and partially into a portion of the workpiece beneath the buried layer, and wherein forming the second isolation ring structure comprises forming a second isolation ring structure that extends partially through the buried layer.

15. A method of manufacturing a semiconductor device, the method comprising:
    forming a buried layer beneath a top portion of a workpiece;
    forming an isolation ring structure within the top portion of the workpiece and extending completely through at least a portion of the buried layer, the isolation ring structure comprising a ring having an interior region;
    forming a diffusion confining structure within the interior region of the isolation ring structure; and
    forming a conductive region within the top portion of the workpiece within a portion of the interior region of the isolation ring structure, the conductive region comprising at least one dopant element implanted and diffused into the top portion of the workpiece, wherein the diffusion confining structure defines at least one edge of the conductive region, and wherein the conductive region is coupled to the buried layer.

16. The method according to claim 15, wherein the diffusion confining structure comprises a trench, wherein the trench defines a first edge of the conductive region, wherein the trench includes an insulating material disposed therein, and wherein the isolation ring structure defines a second edge of the conductive region.

17. The method according to claim 16, wherein the trench extends from proximate a first side of the isolation ring structure to proximate a second side of the isolation ring structure, the trench being spaced apart from the isolation ring structure.

18. The method according to claim 16, wherein the trench extends completely from a first side of the isolation ring structure to a second side of the isolation ring structure.

19. The method according to claim 15, wherein the diffusion confining structure defines at least two edges of the conductive region.

20. The method according to claim 15, wherein the isolation ring structure comprises a first isolation ring structure, wherein the diffusion confining structure comprises a second isolation ring structure, the second isolation ring structure being disposed within the first isolation ring structure, and wherein the conductive region is disposed within the second isolation ring structure.

21. A method of manufacturing a semiconductor device, the method comprising:
    forming a buried layer beneath a top portion of a workpiece, the buried layer being conductive and being coupled to an active area of the workpiece;
    forming an isolation ring structure within the top portion of the workpiece extending completely through at least a portion of the buried layer, the isolation ring structure comprising a ring having an interior region;
    forming a diffusion confining structure within the interior region of the isolation ring structure; and
    forming a conductive region within the top portion of the workpiece within a portion of the interior region of the isolation ring structure, the conductive region comprising at least one dopant element implanted and diffused into the top portion of the workpiece, wherein the diffusion confining structure defines at least one edge of the conductive region, wherein the isolation ring structure isolates the conductive region from adjacent devices disposed in the workpiece, and wherein the conductive region makes electrical contact to the buried layer.

22. The method according to claim 21, wherein the isolation ring structure comprises a first width, and wherein the diffusion confining structure comprises a second width, the second width being substantially the same as the first width.

23. The method according to claim 21, wherein the isolation ring structure comprises a first width, and wherein the diffusion confining structure comprises a second width, the second width being less than the first width.

24. The method according to claim 21, wherein the isolation ring structure extends a first depth within the workpiece, and wherein the diffusion confining structure extends a second depth within the workpiece, the second depth being substantially the same as the first depth.

25. The method according to claim 21, wherein the isolation ring structure extends a first depth within the workpiece, and wherein the diffusion confining structure extends a second depth within the workpiece, the second depth being less than the first depth.

26. The method according to claim 21, further comprising forming a conductive line, a conductive pad, or a contact disposed over and adjacent the conductive region, and wherein the conductive region provides electrical connection from the conductive line, conductive pad, or contact to the active area of the workpiece.

27. The method according to claim 26, wherein the active area comprises a portion of a transistor.

* * * * *